(12) United States Patent
Wheaton

(10) Patent No.: US 10,175,317 B2
(45) Date of Patent: Jan. 8, 2019

(54) QUIET MRI USING ALTERNATING GRADIENT SEQUENCE

(71) Applicant: TOSHIBA MEDICAL SYSTEMS CORPORATION, Otawara-shi, Tochigi (JP)

(72) Inventor: Andrew J. Wheaton, Vernon Hills, IL (US)

(73) Assignee: TOSHIBA MEDICAL SYSTEMS CORPORATION, Otawara-Shi, Tochigi (JP)

( * ) Notice: Subject to any disclaimer, the term of this patent is extended or adjusted under 35 U.S.C. 154(b) by 231 days.

(21) Appl. No.: 15/179,014

(22) Filed: Jun. 10, 2016

(65) Prior Publication Data

US 2017/0356972 A1 Dec. 14, 2017

(51) Int. Cl.
*G01V 3/00* (2006.01)
*G01R 33/385* (2006.01)
*G01R 33/48* (2006.01)
*G01R 33/561* (2006.01)

(52) U.S. Cl.
CPC ..... *G01R 33/3854* (2013.01); *G01R 33/4822* (2013.01); *G01R 33/5614* (2013.01); *G01R 33/4826* (2013.01)

(58) Field of Classification Search
CPC .. G01R 33/34; G01R 33/34007; G01R 33/36; G01R 33/3635; G01R 33/3642; G01R 33/48; G01R 33/4818; G01R 33/481; G01R 33/4824; G01R 33/446; G01R 33/4835; G01R 33/4828; G01R 33/54; G01R 33/543; G01R 33/561; G01R 33/563; G01R 33/565; G01R 33/5611; G01R 33/5612; G01R 33/583; G01R 33/5659; G01R 33/56518; G01R 33/56536; G01R 33/56572; G01R 33/5614; G01R 33/5616; G01R 33/56509; G01R 33/341;
(Continued)

(56) References Cited

U.S. PATENT DOCUMENTS 8,610,432 B2 * 12/2013 Shigeta ............. G01R 33/4824
324/307
9,753,113 B2 * 9/2017 Blumhagen ...... G01R 33/56563
9,841,478 B2 * 12/2017 Paul ....................... G01R 33/54
(Continued)

OTHER PUBLICATIONS

Stehning, C. et al., "Fast Isotropic Volumetric Coronary MR Angiography Using Free-Breathing 3D Radial Balanced FFE Acquisition," Magnetic Resonance in Medicine, 52:197-203 (2004).
(Continued)

*Primary Examiner* — Thang Le
(74) *Attorney, Agent, or Firm* — Nixon & Vanderhye P.C.

(57) ABSTRACT

Magnetic resonance imaging (MRI) systems and methods to effect MRI data acquisition with reduced noise are described. A readout gradient, having a first polarity used to acquire and store MRI data in k-space memory during analog-to-digital conversion (ADC) of MR RF signals during one TR interval, is continued at substantially a same amplitude and vector direction and used as an image volume selection gradient during a transmitted RF excitation pulse that begins a next TR interval before the readout gradient transitions to an opposite polarity. The acquired k-space data is then used to generate an MR image.

18 Claims, 5 Drawing Sheets

(58) Field of Classification Search
CPC ............ G01R 33/385; G01R 33/56358; A61B 5/055; A61B 5/0555; A61B 5/7278; A61B 5/725
USPC .................................................. 324/300–322
See application file for complete search history.

(56) References Cited

U.S. PATENT DOCUMENTS

| | | | | |
|---|---|---|---|---|
| 2002/0036499 | A1* | 3/2002 | Thesen | G01R 33/56509 324/307 |
| 2004/0140802 | A1* | 7/2004 | Zhang | G01R 33/56554 324/307 |
| 2012/0313641 | A1* | 12/2012 | Labadie | G01R 33/4818 324/309 |
| 2013/0249548 | A1* | 9/2013 | Stemmer | G01R 33/4835 324/309 |
| 2014/0097840 | A1 | 4/2014 | Grodzki | |
| 2014/0210471 | A1* | 7/2014 | Stemmer | G01R 33/56554 324/309 |
| 2015/0285881 | A1* | 10/2015 | Ott | G01R 33/30 324/309 |

OTHER PUBLICATIONS

Bieri, O. et al., "Fundamentals of Balanced Steady State Fee Precession MRI," Journal of Magnetic Resonance Imaging 38:2-11 (2013).
Brodsky, E., et al., "Characterizing and Correcting Gradient Errors in Non-Cartesian Imaging: Are Gradient Errors Linear Time-Invariant (LTI)?" Magnetic Resonance in Medicine 62:1466-1476 (2009).
Grodzki, D., et al., "Ultrashort Echo Time Imaging Using Pointwise Encoding Time Reduction With Radial Acquisition (PETRA)," Magnetic Resonance in Medicine 67:510-518 (2012).
Hennel, F., et al., "'Silent' MRI With Soft Gradient Pulses," Magnetic Resonance in Medicine 42:6-10 (1999).
Ida, M., et al., "Quiet T1-Weighted Imaging Using PETRA: Initial Clinical Evaluation in Intracranial Tumor Patients," Journal of Magnetic Resonance Imaging 41:447-453 (2015).
Jackson, J., et al., "Selection of a Convolution Function for Fourier Inversion Using Gridding," IEEE Transactions on Medical Imaging 10:473-478, No. 3, (Sep. 1991).
Kuethe, D., et al., "Imaging Lungs Using Inert Fluorinated Gases," Magnetic Resonance in Medicine 39:85-88 (1998).
Madio, D., et al., "Ultra-Fast Imaging Using Low Flip Angles and FIDs," Magnetic Resonance in Medicine 34:525-529 (1995).
Park, J., et al., "Short Echo-Time 3D Radial Gradient—Echo MRI Using Concurrent Dephasing and Excitation," Magnetic Resonance in Medicine 67:428-436 (2012).
Pipe, J., et al., "Sampling Density Compensation in MRI: Rationale and an Iterative Numerical Solution," Magnetic Resonance in Medicine 41:179-186 (1999).
Pipe, J., "Reconstructing MR Images From Undersampled Data: Data-Weighting Considerations," Magnetic Resonance in Medicine 43:867-875 (2000).
Segbers, M., et al., "Shaping and Timing Gradient Pulses to Reduce MRI Acoustic Noise," Magnetic Resonance in Medicine 64:546-553 (2010).
Wech, T., et al., "Using Self-Consistency for an Interative Trajectory Adjustment (SCITA)," Magnetic Resonance in Medicine 73:1151-1157 (2015).
Weiger, M., et al., "Sweep MRI with Algebraic Reconstruction," Magnetic Resonance in Medicine 64:1685-1695 (2010).
Wu, Y., et al. "Bone Mineral Imaged in Vivo by $^{31}$P Solid State MRI of Human Wrists," Journal of Magnetic Resonance Imaging 34:623-633 (2011).

* cited by examiner

QUIET MRI USING ALTERNATING GRADIENT SEQUENCE

FIELD

The subject matter below relates generally to magnetic resonance imaging (MRI), and more particularly to systems and methods for MRI imaging with reduced acoustic noise.

DETAILED DESCRIPTION

Figure 1:
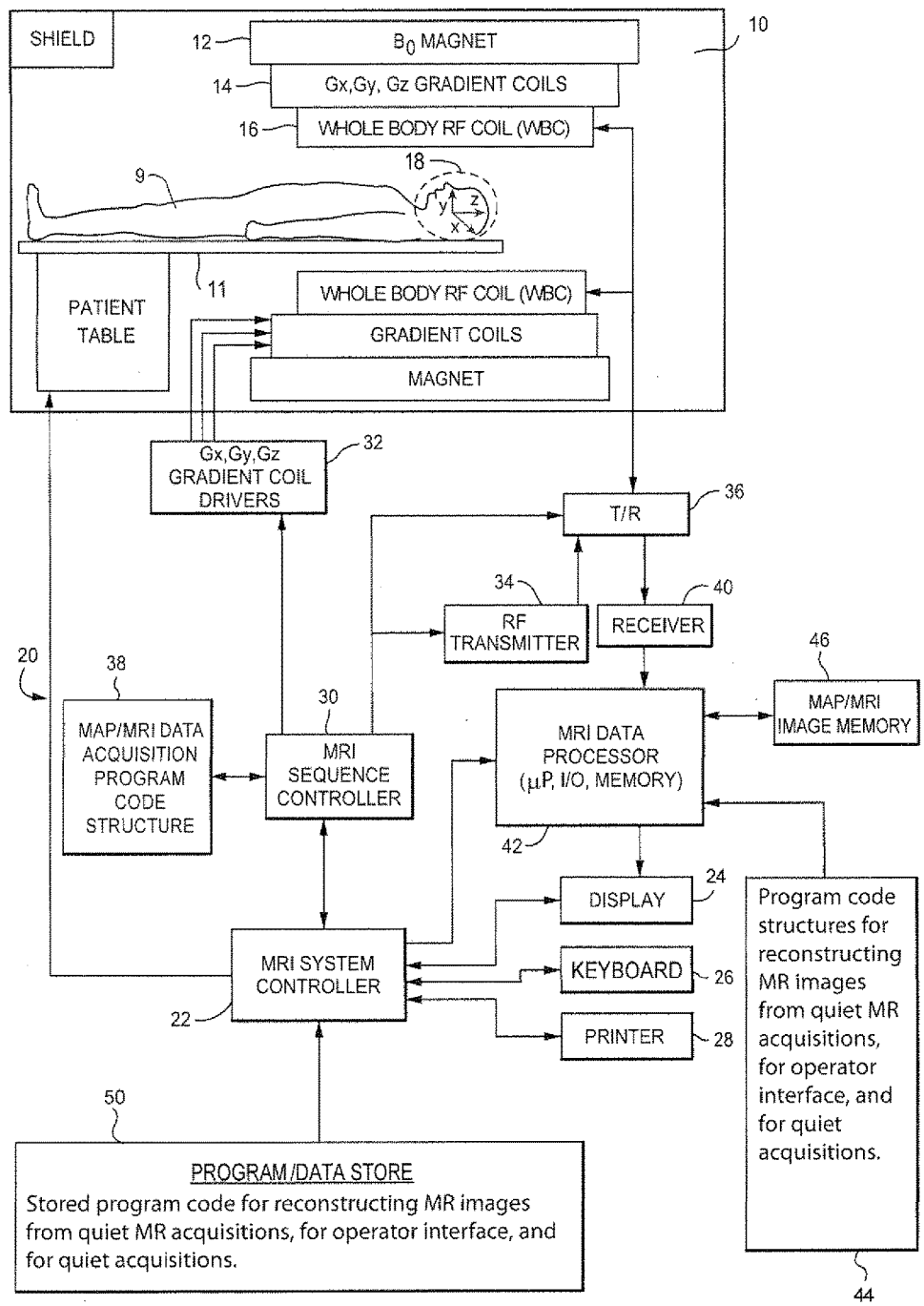
FIG. 1 is a high level schematic block diagram of an MRI system adapted for reducing acoustic noise generated during MRI scanning in accordance with one or more embodiments.

Current MRI scanners may produce a high level of acoustic noise during scanning. While acoustic noise levels about 90-100 dBA are typical in many conventional MRI systems, the noise levels can often reach higher than 130 dBA. Comparing these levels with the noise level of a rock concert at 110 dBA or a jackhammer at 100 dBA, one can appreciate the excessiveness of such noise levels in a medical application. High levels of noise during the MRI scanning process is undesirable because it can lead to discomfort for the patient and patient complaints. Excessive noise is particularly undesirable in pediatric clinical applications and applications for the elderly.

The noise is primarily due to current provided to gradient magnetic field coils for spatial encoding and readout during MRI data acquisition sequences ("scanning"). More specifically, as described in Hennel et al., "'Silent' MRI Soft Gradient Pulses", Magnetic Resonance in Medicine, 42:6-10, 1999, this "scanner noise" is produced by vibrations in the gradient coil related structures due to induced Lorentz forces which are proportional to the product of magnetic field strength and the gradient of amplitude changes (e.g., slew rate). Such "scanner noise" is sometimes referred to in this document as "acoustic noise" or simply as "noise" where the meaning is sufficiently clear.

Earlier attempts to reduce MRI scanning noise have reduced sound pressure by using a vacuum chamber to surround the gradient coil(s). More recently some products also use MRI data acquisition sequence optimizations for reducing noise.

Some conventional MR data acquisition sequence optimizations for reduced noise use long duration gradient transitions and low duration sampling bandwidth. Other conventional techniques include the use of low-pass filtered or sinusoidal gradient transitions, use of conventional reconstruction (without radial or special gridding) etc. Such conventional techniques do provide a partial reduction in acoustic noise. Although these techniques often resulted in low rate of change (i.e., dG/dt, "slew rate") of the gradient amplitude, they may not result in a reduction in the number of gradient transitions per repetition interval (TR). For example, comparison of a conventional pulse sequence and a corresponding prior reduced noise pulse sequence illustrates that the number of gradient transitions remain substantially the same although for some transitions the dG/dt (slew rate) is lower, and hence the level of noise is reduced.

For example, in one prior arrangement a gradient transition may be performed before transmission of an RF excitation pulse and then held constant throughout the acquisition of MR data. The RF excitation pulse is transmitted after the Gx, Gy, Gz gradients have been fully activated (e.g., fully ramped). Initially MRI data is acquired in a radial pattern but not including a central area including the k-space center. However, immediate data collection (e.g., with TE of zero), is limited by how quickly the RF pulse transmitter can be turned off and how quickly the RF receiver can be turned on. Due to these limitations, which result in a delay of about 100 microseconds between the times of RF pulse transmission and the start of MRI data collection, an area including the k-space center is not sampled when sampling k-space for the spokes of this type of radial acquisition. To fill in the missing k-space center area, data are either estimated algebraically, or subsequently acquired using a second radial acquisition with a reduced gradient amplitude, or a pointwise Cartesian scanning pattern. Thus, although the resulting noise level can be substantially reduced during the radial data acquisition phase, because each gradient transition is small, the subsequent separate Cartesian-patterned filling of missing points in the center of k-space can cause additional, or at least inconsistent, noise and data inconsistencies to be resolved during image reconstruction processes—often imperfectly resolved so as to leave image artifacts.

Some conventional techniques also require switching on Gx, Gy and Gz gradients to provide a pre-winder gradient during acquisition of 3D MRI data, and this is at least partially responsible for excessive acoustic noise. For example, conventional Cartesian acquisition patterns require a pre-winder gradient before each readout gradient (e.g., so that data collection can begin at the beginning of the next row in k-space). Moreover, some such conventional noise-reduction techniques lose at least some ability for motion correction in reconstructed images because they acquire the k-center region and the region outside the k-center region separately. Not having the k-space center, which yields information for the entire image, in each acquisition reduces motion correction capability. Still further, such techniques may require combining of radial and Cartesian data which can lead to inconsistencies.

For example, because, the radial and Cartesian data sub-sets are acquired at different times and also because of the need for interpolation when combining radial with Cartesian data sub-sets, such combination of differently organized data can lead to data mismatch. Even further, some prior techniques are limited to half-echo (e.g., lower sampling frequencies and/or shorter echo times) projection acquisition (e.g., because, without pre-winder, data acquisition may be limited to starting from zero for each spoke of the radial acquisition), and an increased number of projections (e.g., TR intervals) are required to obtain full coverage of k-space. There may also be an added disadvantage of inconsistent acoustic noise because while the radial part of the acquisition may be relatively quiet, the Cartesian part is louder. Inconsistent noise levels also may be unsettling to the patient being scanned.

Example embodiments of the subject matter disclosed herein provide for MRI scanning with substantially reduced noise. In example embodiments, k-space is sampled by executing pulse sequences configured such that the number of gradient transitions is reduced, which in turn results in a substantial noise reduction. In particular, example embodiments cause only one substantial gradient transition per TR, thereby substantially reducing the number of gradient transitions performed throughout the scanning process.

In essence, a previous readout gradient (for one TR interval) becomes the next RF excitation selection gradient (for the next TR interval). That is, there is no substantial transition between a previous readout gradient and the next RF transmit. This approximates an alternating gradient, except that example gradient embodiments (in both amplitude and polarity) do impose a slight rotation in projection angle (after the readout period in one TR integral and before the readout period of the next TR interval) in order to acquire k-space data in a 3D radial pattern. MR images are reconstructed from the acquired k-space data. In contrast to conventional techniques, the example embodiments, while reducing acoustic noise, also still preserve motion correction capability and the like in MR data acquisitions, and do not require such complex further processing of acquired MR data in reconstruction of an image.

The MRI system shown in FIG. 1 includes a gantry 10 (shown in schematic cross-section) and various related system components 20 interfaced therewith. At least the gantry 10 is typically located in a shielded room. The MRI system geometry depicted in FIG. 1 includes a substantially coaxial cylindrical arrangement of the static field $B_0$ magnet 12, a Gx, Gy and Gz gradient coil set 14 and a large whole body radio frequency (RF) coil (WBC) assembly 16. Along the horizontal axis of this cylindrical array of elements is an imaging volume 18 shown as substantially encompassing the anatomy of interest (i.e., region of interest or "ROI") for a patient 9 supported by a patient table 11.

In some embodiments, a smaller array RF coil (not shown) might be coupled to a portion of the patient such that the imaging volume would include the area encompassed by the smaller array RF coil. As those in the art will appreciate, compared to the WBC (whole body coil), relatively small coils and/or arrays such as surface coils or the like are often customized for particular body parts (e.g., arms, shoulders, elbows, wrists, knees, legs, chest, spine, etc.). Such smaller RF coils are herein referred to as array coils (AC) or phased array coils (PAC). These may include at least one coil configured to transmit RF signals into the imaging volume and one or more receiver coils configured to receive RF signals from the imaging volume.

An MRI system controller 22 has input/output ports connected to a display 24, keyboard 26 and printer 28. As will be appreciated, the display 24 may be of the touch-screen variety so that it provides control inputs as well.

The MRI system controller 22, or a computer coupled to the MRI system controller 22, may be operated to provide the MRI sequence controller 30 information about a pulse sequence and/or to manage the operations of the entire system, according to installed software programs. The MRI system controller 22 may also serve as an element for instructing a patient to perform tasks, such as, for example, a breath hold by a voice message produced using an automatic voice synthesis technique.

The MRI system controller 22 interfaces with MRI sequence controller 30 which, in turn, controls the Gx, Gy and Gz gradient coil drivers 32, as well as the RF transmitter 34 and the transmit/receive switch 36 (if the same RF coil is used for both transmission and reception). The MRI sequence controller 30 includes suitable program code structure 38 for implementing MRI imaging (also known as nuclear magnetic resonance, or NMR, imaging) techniques. The MRI imaging techniques may include, for example, parallel imaging and/or other imaging sequences.

The pulse-sequence information includes information required for operating the Gx, Gy and Gz gradient coil drivers 32, as well as the RF transmitter 34 and the transmit/receive switch 36 (if the same RF coil is used for both transmission and reception) according to a pulse sequence. Such information includes the strength, duration, and application timing of pulsed currents applied to the x-, y-, and z-coils. A duty cycle or repetition interval (TR) is also controlled by the system controller 22 and/or sequence controller 30. The transmission of pulse sequences, duty cycle etc. may be controlled by the MRI system controller 22, MRI sequence controller 30, and/or MRI data processor 42 based on, for example, program code for a signal acquisition pattern such as, for example, radial acquisition such as, but not limited to, 3D isotropic acquisition described in relation to FIGS. 2-3.

The MRI system 20 includes an RF receiver 40 providing input to data processor 42 so as to create processed image data, which is sent to display 24. The MRI data processor 42 is also configured for access to system configuration parameters 46, program code structures 44 and program/data store 50. MRI program code structures 44 and 50 may, in addition to control logic for reconstructing MRI images, also include control logic to obtain MR data with reduces acoustic noise from gradient coils 14. Process such as, for example, processes 400 and 500 described below in relation to FIGS. 4 and 5, respectively, can be performed by the MRI system controller 22, MRI sequence controller 30, and/or MRI data processor 42.

Although shown in FIG. 1 as being located away from the RF coil 16, in some embodiments, any of RF transmitter 34, transmit/receive switch 36, and RF receiver 40 may be located in close proximity to, or on a surface of, the RF coils 16 and/or other RF coil.

Also illustrated in FIG. 1 is a generalized depiction of an MRI system program/data store 50 where stored program code structures (e.g., for controlling reduced acoustic noise data acquisition according to radial scan techniques, for improved image reconstruction of radial k-space acquisitions, for defining graphical user interfaces (GUI), accepting operator inputs), and configured or predetermined data (e.g., certain threshold settings for controlling program execution, parameters for controlling noise reduced MR data acquisition and subsequent MR image reconstruction) are stored in non-transitory computer-readable storage media accessible to the various data processing components of the MRI system. As those in the art will appreciate, the program store 50 may be segmented and directly connected, at least in part, to different ones of the system 20 processing computers having most immediate need for such stored program code structures in their normal operation (i.e., rather than being commonly stored and connected directly to the MRI system controller 22).

Indeed, as those in the art will appreciate, the FIG. 1 depiction is a very high level simplified diagram of a typical MRI system with some modifications so as to practice exemplary embodiments described herein. The system components can be divided into different logical collections of "boxes" and typically comprise numerous digital signal processors (DSP), microprocessors and special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an image reconstruction process and/or sometimes a coil sensitivity map generation process, an array of computer-readable accessible data value storage sites in physical storage media will be transformed from some prior state (e.g., all uniform "zero" values or all "one" values) to a new state wherein the physical states at the physical sites of such an array vary between minimum and maximum values to represent real world physical events and conditions (e.g., the internal physical structures of a patient over an imaging volume space). As those in the art will appreciate, such arrays of stored data values represent and also constitute a physical structure—as does a particular structure of computer control program codes that, when sequentially loaded into instruction registers and executed by one or more CPUs of the MRI system 20, cause a particular sequence of operational states to occur and be transitioned through within the MRI system.

Figure 2:
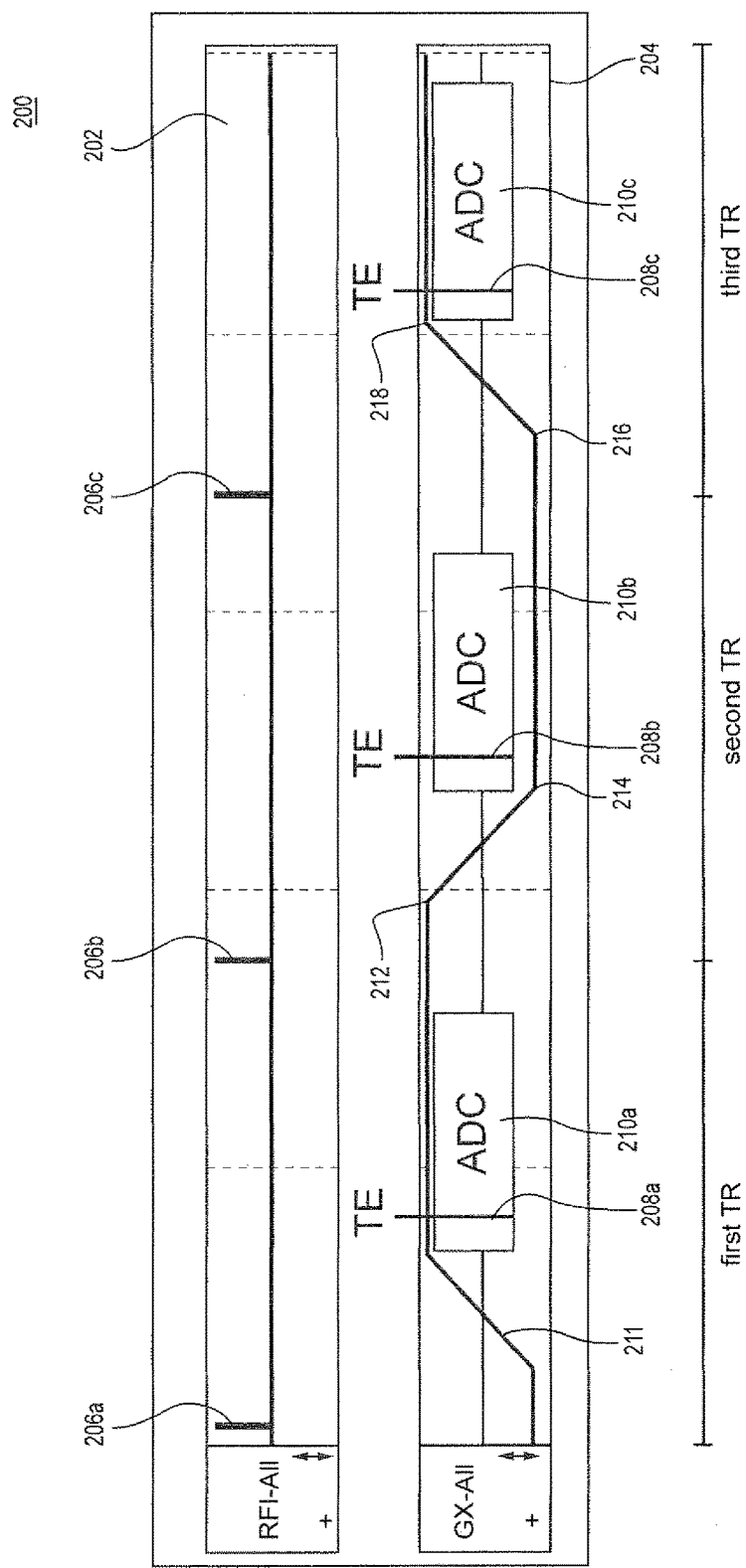
FIG. 2 illustrates a portion of an example MRI data acquisition sequence over three repetition intervals, according to some example embodiments.

FIG. 2 illustrates a MR data acquisition pattern 200 according to some example embodiments. Gradient waveform 211 shown in display window 204 schematically illustrates the Gx gradient (readout gradient) over three successive TR intervals during the process of acquiring a 3D radial pattern in accordance with example embodiments. In each window 202 and 204, the horizontal line starting halfway through the vertical axis represents a zero value magnitude or amplitude, and the horizontal axis represents time. Window 202 illustrates RF excitation pulses 206a-c (collectively 206) in relation to a gradient waveform 211. Corresponding echo times (TE) 208a-c (collectively 208) and MRI data read-out ADC (analog to digital conversion) sampling intervals 210a-c (collectively 210) are also shown in window 204.

As seen in window 204, for each TR interval, gradient waveform 211 has only a single transition. Each RF excitation pulse 206 is positioned such that, a transition of the gradient waveform 211 to the opposite polarity occurs after the RF excitation pulse 206 but before the corresponding MR data acquisition. For example, RF excitation pulse 206b of the second TR occurs after data collection ADC interval 210a of the first TR interval and before the gradient waveform 211 begins to transition at 212. In response to RF excitation pulse 206b, the echo time 208b occurs after the transition begun at 212 has completed at 214 thereby changing the gradient waveform 211 from an amplitude of positive polarity to an amplitude of negative polarity. As those in the art will appreciate a small incremental change in Gx, Gy, Gz gradient amplitudes will be effected so as to trace out a slightly different radial trajectory in k-space during the next TR interval. However, the change in magnitude from one TR interval to the next will be insubstantial insofar as acoustic noise generation forces are concerned. Although shown in FIG. 2 as starting after the completion of the gradient transition at 214, data acquisition 210b may be started at any time after RF excitation and before echo time 208b. The data acquisition includes analog to digital conversion (ADC), and is identified in FIG. 2 simply as ADC.

In the third TR shown in window 204, RF excitation pulse 206c is transmitted (i.e., radiated) after data collection interval 210b of the second TR interval and before the transition at 216 of gradient waveform 211. Then, still within the third TR, a gradient transition to the opposite polarity (and a slightly different magnitude) completes at 218. Echo time 208c and data acquisition interval 210c occur when the gradient waveform 211 has completed its transition from a negative amplitude to a positive amplitude that is only slightly changed.

By transitioning gradient polarity after the RF excitation pulse but before the corresponding echo time TE, embodiments automatically provide a pre-winder gradient which enables MRI data collection to track along a line (i.e., a trajectory) in the radial collection of k-space data so as to start on one side of zero (i.e., the k-space center) and then to continue obtaining data along a trajectory passing through the zero point and continuing for points on the opposite side of zero from where data collection started. This provides example embodiments with the ability, while having only a single transition per TR, to also collect data for k-space center and for points on either side of k-space center during a radial acquisition sequence. Thus, in contrast to many conventional techniques, example embodiments eliminate acoustic noise caused by more than one transition per TR—while also eliminating acoustic noise caused by a separate pre-winder gradient pulse needed to acquire data on both sides of zero along a line in a radial acquisition of k-space data.

The pre-winder in example embodiments may be described in relation to FIG. 2. When, for example, excitation pulse 206a is radiated, gradient 211 is already active at the then-commanded amplitude with negative polarity. Thus, in the example embodiments shown, the pre-winder starts just after the RF excitation pulse because the imaging volume begins accruing spins with opposite polarity k-space moment. Data collection at any time before TE (e.g., 208a with respect to excitation pulse 206a) yields signal from these spins with negative k-space moment thereby providing data points on one side of k-space center for the line (e.g., trajectory going through the k-space center or zero point) being currently collected. Upon occurrence of TE, the ongoing data collection process yields data points for the k-space center and the opposite side along the radial line for which data is then being collected. The data collected after TE may be referred to as gradient recalled echo (GRE) data.

The gradient amplitude is the same or is substantially the same for an ADC time in a first TR and the RF excitation pulse of the next TR. This approximates an alternating gradient, but with a slight rotation in projection angle being imposed from one TR interval to the next in order to acquire a 3D radial pattern of trajectories in k-space. However, a small change to the value of the amplitude is made in order to sample different points in k-space according to a 3D radial pattern. Typically, this small change is applied after the readout acquisition is completed and before the next excitation is effected. In the 3D radial pattern, each of the Gx, Gy and Gz gradients follow respective characteristic patterns which have one primary transition per TR and one smaller, secondary transition to effect the small change in rotation angle. Techniques for determining necessary small gradient changes between successive TR intervals are discussed below.

The description here assumes a non-selective RF excitation pulse width whereby a relatively large area is excited.

The MRI data acquisition and subsequent image reconstruction in this example are not significantly affected by whether RF excitation is performed with or without a selection gradient. The spatial direction of the selection by the RF pulse is inconsequential because the effective selection is nonselective.

In example embodiments, the primary gradient transition also can be configured to be relatively long duration so that the slew rate is reduced. Moreover, when MRI data is acquired in a radial k-space pattern in example embodiments, the slew rate may remain at the same consistent level for every transition. This can reduce noise generated as a result of a high slew rate, and, moreover, can avoid sudden and inconsistent highs (e.g., peaks) in noise that is generated due to the changes being made at any particular slew rate.

It should be noted that although acoustic noise is drastically reduced in certain example embodiments, some noise still exists. However, that noise may be a more consistent and lower level noise than that realized in conventional techniques. Some remaining noise inconsistency may be due to slightly different acoustic signatures of different gradient coils. For example, as the sequence changes between greater and lesser amplitudes in Gx, Gy and Gz currents, noise levels may change due to different physical structure, location and/or other mechanical environment aspects of these different coils.

Figure 3:
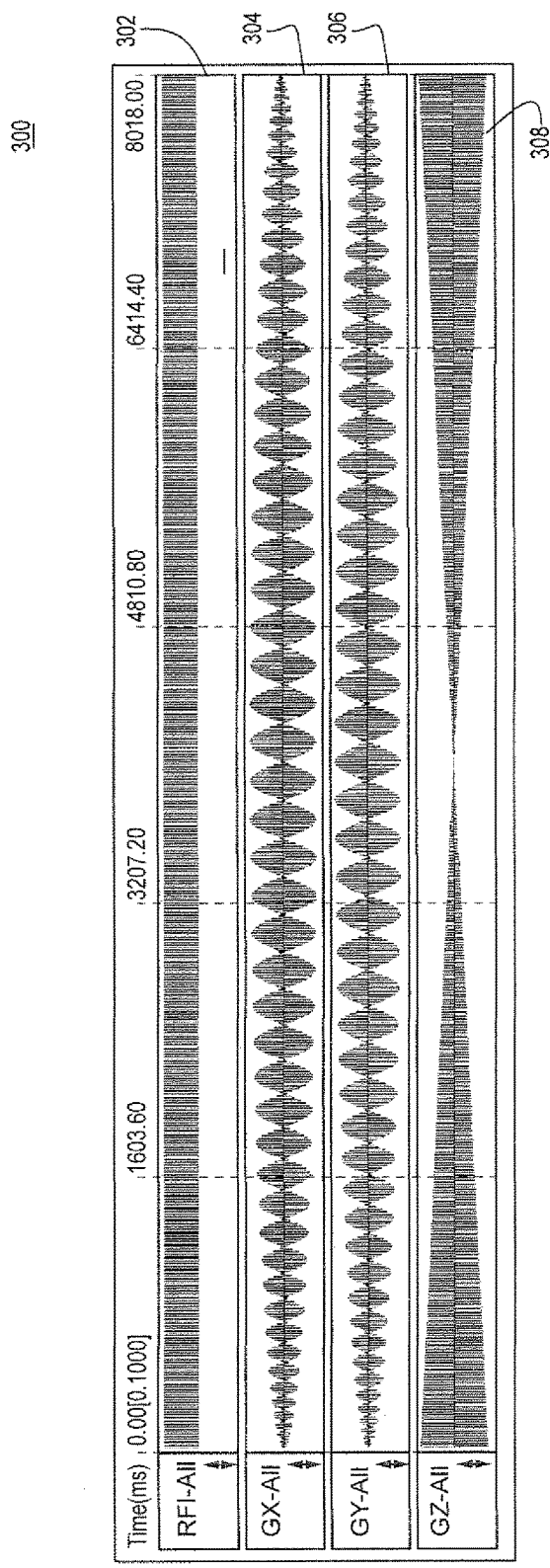
FIG. 3 illustrates the MRI data acquisition sequence, of which a portion is shown in FIG. 2, sampling k-space in a 3D isotropic projection pattern with reduced acoustic noise, according to some example embodiments.

FIG. 3 illustrates a 3D isotropic radial pattern scanning sequence including waveforms for. Gx, Gy and Gz gradients for a complete acquisition of a volumetric MR image over many TR intervals. FIG. 3 at 300 illustrates alternating gradient fields which are configured to have small differences in gradient amplitudes from one TR interval to the next in order to sample k-space along successive trajectories in a radial k-space pattern. FIG. 3 illustrates RF excitation, Gx gradient, Gy gradient, and Gz gradient pulses used during acquisition of MRI data for a 3D isotropic radial projection pattern in k-space. The acquisition shown in FIG. 3 illustrates an acquisition duration of 8018 ms. Window 302 illustrates the pattern of RF excitation pulses, such as, for example, pulses 206a-c. Windows 304, 306 and 308, illustrate the Gx, Gy and Gz gradients, respectively, during the acquisition duration. What is shown in expanded form in FIG. 2 is a small portion of the MR data acquisition sequence shown in FIG. 3.

In the embodiment shown in window 302 of screen 300, RF excitation pulses are transmitted, one per TR interval. Windows 304, 306 and 308 illustrate the Gx gradient, Gy gradient and Gz gradient changes throughout the acquisition duration. As shown, Gx, Gy and Gz gradients repeatedly change in the positive and negative directions with maximum gradient magnitudes changing gradually in small amounts from one TR interval to the next as noted above and as further described below in relation to FIG. 5. The Gx, Gy and Gz gradients at any particular TR interval acquire MRI data along a respectively corresponding defined trajectory in k-space. In this example, the trajectories are radially directed and pass through the center of k-space.

Figure 4:
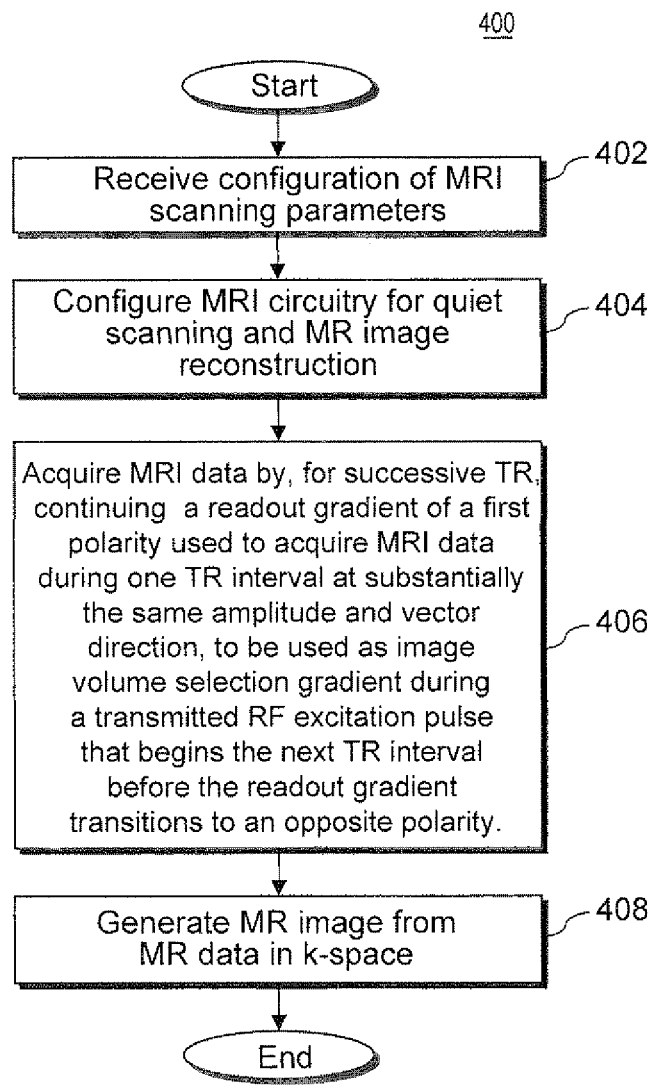
FIG. 4 illustrates a flowchart of a process for MRI scanning with reduced acoustic noise and MR image reconstruction, in accordance with one or more embodiments.

FIG. 4 illustrates a flowchart of a process 400 for quiet acquisition of MRI data, and reconstruction of MR images. In embodiments, operations 402-408 may be performed in the order shown or in a different order. One or more operations 402-408 may not be performed in some embodiments, and one or more new operations may be performed in some other embodiments.

At operation 402, after process 400 is entered, an MRI system obtains configuration parameters for quiet scanning and reconstruction in accordance with one or more embodiments. Configuration parameters can include the length of gradient transition (e.g., 1500-2000) microseconds), TE (e.g., 2-4 ms) and TR (e.g., 5-9 ms), slew rate (e.g., 5-10 mT/m/ms milliTesla per meter per millisecond). A reasonable field of view (FOV), for example, of 25 cm, can be achieved with slew limited to 5-10 mT/m/ms. At a slew rate of approximately 5-10 mT/m/ms the scanning is quieter than most conventional techniques, but still produces some acoustic noise.

Another configuration parameter may be the number of radial projections (e.g., radial lines going through k-space center or zero) which may be necessary for determining the small changes to be effected in the amplitude of the gradients and/or projection angles as successive data points are scanned. The number of radial projections, or trajectories through the zero point of k-space, may range from about 1,000 to 100,000. 30,000 radial projections, in some example embodiments, is sufficient to provide an MR image of diagnostic quality.

In example embodiments, the frequency response of the primary gradient transition can be tuned to match (e.g., approximate) an acoustic frequency null point of the MR system. This matching may be considered a part of pulse sequence design, and may be part of the configuration process at operation 402. In some embodiments, the duration of the repeating TR intervals can be controlled to match an acoustic null of the MRI system.

As noted elsewhere, one feature of certain embodiments, is that the same, or substantially the same, gradient transitions are applied throughout. Thus, compared to many conventional techniques that have differently formed gradient transitions, the above mentioned matching may be more conveniently achieved using the single primary transition type employed in example embodiments. The matching may be achieved by many known techniques, such as, for example, shaping and timing techniques described in Segbers et al, "Shaping and Timing Gradient Pulses to Reduce MRI Acoustic Noise", Magnetic Resonance in Medicine 64:546-553 (2010).

The shape, width, phase, flip angle, frequency etc., of the excitation pulse, the data collection sequence, etc., are other parameters that can be configured in some embodiments.

At operation 404, the circuits are configured for quiet scanning. Configuring circuits may include configuring according one or both of preconfigured parameters and/or user provided inputs, and may include configuring one or more of MRI sequence controller 30, the MRI system controller 22, and/or MRI data processor 42. Such configuration may be accomplished by providing suitable executable computer program instructions to the MRI sequence controller 30 which, upon execution of such instructions controls the gradient coil drivers 32 as well as the RF transmitter 34 and in some instances the transmit/receive switch 36.

At operation 406, MRI data is acquired by, for successive TR, continuing a readout gradient of a first polarity used to acquire MRI data during one TR interval at substantially the same amplitude and vector direction, to be used as image volume selection gradient during a transmitted RF excitation pulse that begins the next TR interval before the readout gradient transitions to an opposite polarity. Processing at operation 406 is further described in relation to FIG. 5 below.

At operation 408, an MRI image is reconstructed from the acquired k-space data. According to some embodiments, image reconstruction may be performed directly from the data collected at operation 406. Optionally, in some embodiments, a re-gridding of the k-space data acquired in a radial pattern into a Cartesian grid can be performed before reconstruction. The re-gridding may be performed using a known technique such as, but not limited to, convolution with a finite interpolation kernel, such as a Kaiser-Bessel kernel. Additionally and optionally, in some embodiments, density compensation may be performed prior to image reconstruction. For example, density compensation may be performed to collect more points in k-space center area or more MR data points in the areas further out from the k-space center. A technique such as, but not limited to, multiplication with an analytical de-weighting function or iterative numerical de-weighting solution can be used for density compensation. The k-space data, which may or may not have optionally been processed by re-gridding and/or density compensation, can then be used to generate an MR image by performing Fast Fourier Transform (FFT). In some embodiments, the re-gridding, density compensation, and the FFT processing may be processed using techniques used in ultra short TE (UTE, e.g., TE<1 ms) or projection reconstruction (PR) techniques. The reconstructed MR image may be output to a display for diagnostic purposes, transmitted over a network, and/or stored on a digital storage device.

As those in the art will appreciate, the acquired MRI data may also be stored (locally or remotely) for subsequent image reconstruction.

Figure 5:
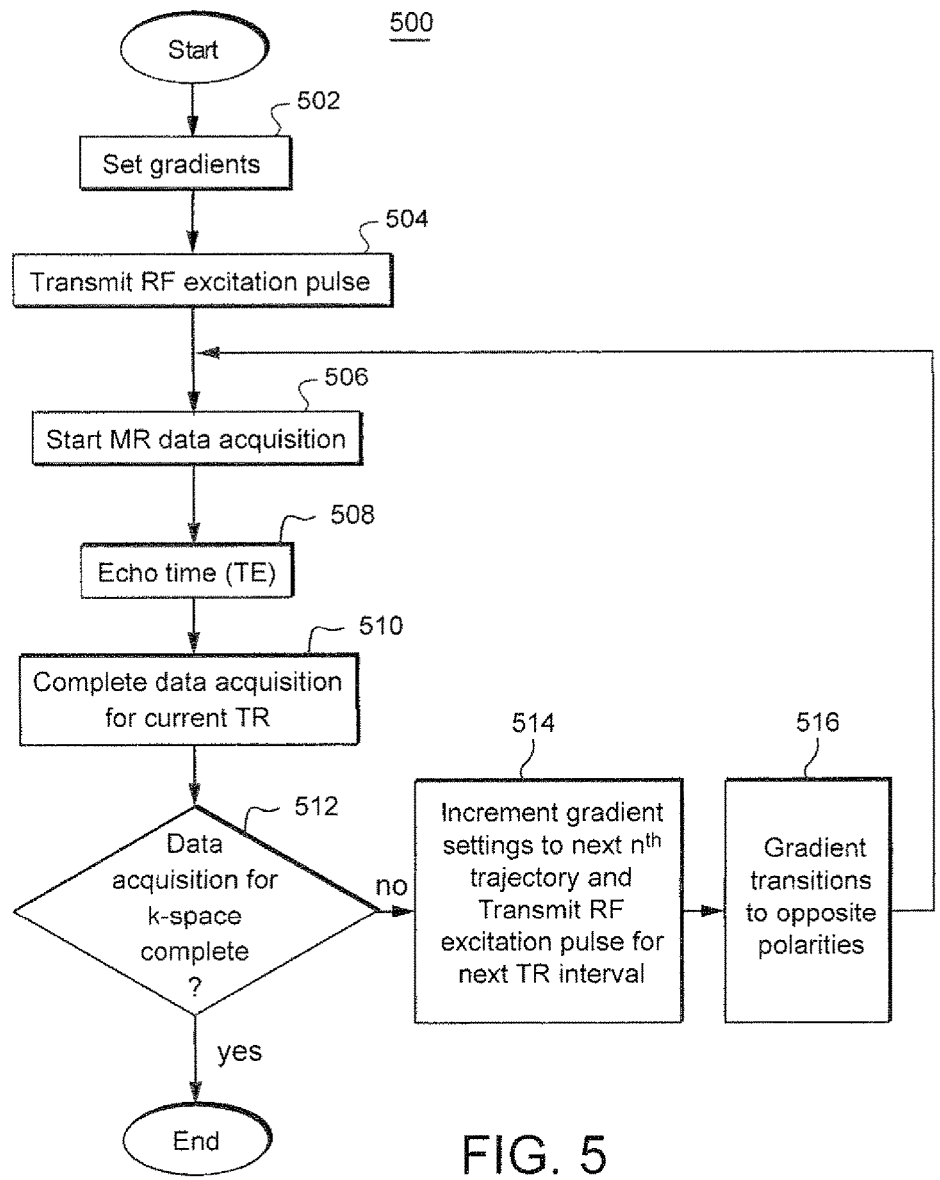
FIG. 5 illustrates a flowchart of a process for configuring gradients and performing related RF excitation and data acquisition, in accordance with one or more embodiments.

FIG. 5 illustrates a flowchart of a process 500 for quiet acquisition of MRI data. In some embodiments, process 500 may be performed to sample k-space during operation 406 of process 400. In some embodiments, operations 502-516 may be performed in the order shown or in a different order. One or more operations 502-516 may not be performed in some embodiments, and/or one or more new operations may be performed in some other embodiments.

After entering process 500, at operation 502, the initial gradients are configured for Gx, Gy and Gz (e.g., readout gradient, phase encode gradient, and selection gradient). Gradients may be configured as shown, for example, in FIGS. 2 and 3 and/or based upon any desired user configurations.

At operation 504, an RF excitation pulse is transmitted. The width, envelope shape, phase, etc. of the excitation pulse may be predetermined by, for example, prior configuration. A first TR interval commences upon transmission of the RF excitation pulse.

Operations 506-516 are repeated for each data point to be acquired, for example, in a 3D isotropic radial acquisition such as that shown in FIG. 3. Indeed, other acquisition patterns are contemplated as embodiments.

At operation 506, still in the same TR interval as was begun by the immediately preceding RF excitation pulse, data acquisition (including analog to digital conversion) is commenced. Acquisition of MRI data within this TR interval begins before the echo time (TE) 508. K-space MRI data is acquired at 510 along a radially directed trajectory in k-space, and the readout gradient is continued in the next TR interval after occurrence of the transmitted next RF excitation pulse at 514 as a pre-winder gradient sufficient to insure an acquired MRI data trajectory in k-space during said next TR interval starts on one side of zero and continues onward, through zero, and beyond to the other side of zero in k-space. The acquired radially directed lines of k-space data are distributed over a 3D volume in k-space.

Acquisition of MRI data within said next TR interval can begin immediately after the transmitted RF excitation pulse but before any gradient echoes of said MR signal occur, and can continue during subsequent occurrence of continuing MR signals initiated by the prior RF excitation pulse.

After starting data acquisition, at operation 506 at 508, TE corresponding to the immediately preceding RF excitation pulse occurs and echo data may continue to be acquired.

At operation 510, data acquisition of MR signals initiated by the immediately preceding RF excitation pulse is completed.

After completing the current ADC data acquisition, at operation 512 it is determined whether sufficient k-space data has yet been acquired for k-space. This determination may be based upon a threshold amount of k-space being filled by acquired data. If yes, the process 500 has completed.

If it is determined that sufficient k-space data has not yet been obtained, then at operation 514, another RF excitation pulse is transmitted starting the next TR interval. The RF excitation pulse may be the same as or substantially the same as the previous RF excitation pulse. As described above, the RF excitation pulse may be a non-selective pulse.

In some embodiments, a spoiler gradient may be applied at any time after completing ADC data acquisition and before transmitting the next RF excitation pulse. Such a spoiler gradient can, for example, reduce spurious echo signals caused by earlier excitations. In some embodiments, RF phase cycling can be used to remove such spurious echo signals. For example, while transmitting RF excitation pulses at the same frequency, the phase angle may be changed (e.g. by 117 degree intervals) from one TR interval to the next in order to substantially, or partially, remove spurious echo signals.

At operation 516, the gradients are transitioned to an opposite polarity. The amplitudes of the gradients are incrementally adjusted by less than some threshold amount, such as, for example, less than 5% between data acquisition portions of TR intervals to acquire MRI data along different radially directed trajectories in k-space during successive TR intervals. Indeed, for many embodiments, the incremental adjustment in gradient amplitude from one TR interval to the next may be much less than even 1%. According to some embodiments, the amplitude for each gradient for each successive transition can be determined according to a known technique such as, but not limited to, equations based on those described in Stehning et al., "Fast Isotropic Volumetric Coronary MR Angiography Using Free-Breathing 3D Radial Balanced FFE Acquisition", Magnetic Resonance in Medicine 62:197-203 (2004). Stehning et al. describes "a nearly isotropic coverage of k-space with radial sampling in 3D is achieved by distributing the end points of all projections along a spiral running on a sphere from one pole to the equator." According to an embodiment, based upon Stehning et al. new gradients Gx, Gy and Gz are determined for the $n^{th}$ projections a 3D isotropic projection reconstruction encoding pattern as z(n), x(n) and y(n) with equations (1)-(3):

$$z(n) = \frac{2n - N - 1}{N} \qquad (1)$$

$$x(n) = \cos(\sqrt{N\pi}\sin^{-1}z(n))\sqrt{1-z^2(n)} \qquad (2)$$

$$y(n) = \sin(\sqrt{N\pi}\sin^{-1}z(n))\sqrt{1-z^2(n)} \qquad (3)$$

In (1)-(3), N is the total number of projections to be acquired, and n is the sequence number of the current or "nth" projection. The difference from one acquisition "shot" (e.g., one TR interval) to the next is typically very small, i.e., only a fraction of a degree of rotation. But after thousands, or tens of thousands of rotations, an entire 3D volume is covered. Moreover, the alternating gradient polarity transitions may be limited to a slew rate less than 10 mT/m/ms.

After operation 516, process 500 proceeds back to repeat operation 506, to process the next projection.

Due to large non-selective volume excitation by the RF excitation pulse used in the example embodiments, a 3D projection encoding pattern, in which the sampling of a radial trajectory starts on one side of k-space center and proceeds through k-space center to the other side, is an efficient k-space sampling pattern. However, persons skilled in the art will appreciate that the use of other sample patterns in other embodiments is contemplated.

For example, a balanced steady state free precession (bSSFP) type of sequence can be used for sampling k-space in some embodiments. The bSSFP technique, as known in the art, uses RF pulses that are equidistant to each other and echoes that are equidistant to each other. An bSSFP-type technique can be at least approximately realized and used in embodiments by balancing, in terms of timing, the RF pulses and echoes. Magnetic gradient, RF transmit and RF receive events are coordinated to acquire a substantially balanced steady-state free precession MRI signal. Such a technique provides the benefit of a higher SNR which is characteristic of SSFP-type techniques, but can also lead to artifacts due to B0 sensitivity.

According to another example embodiment, data acquisition may be commenced immediately or soon after (e.g. after a small dead time interval—minimum time to turn off RF transmitter and turn on RF receiver) the transmission of the RF excitation pulse. This enables collection of free induction decay (FID) data that occurs in the volume immediately after the excitation pulse is transmitted. This FID data can be used along with acquired subsequently occurring GRE data.

The embodiments described herein provide many advantages over conventional techniques for acoustic noise reduction in MRI scanning. Among these advantages are a greater sampling efficiency, capture of k-space center region in same ADC acquisition interval as capture of the area outside the k-space center region, more efficient image reconstruction due to data consistency because data are acquired in one acquisition instead of multiple acquisitions or algebraic estimation, more conventional image contrast due to TE and TR being similar to conventional pulse sequences, and the ability to maintain a more consistent level of noise.

Greater sampling efficiency is achieved by a capability in embodiments to obtain k-space center and points on both sides of the k-space center along one radial trajectory line in the same data acquisition TR interval. As noted above, by transmitting the excitation pulse when substantially the same gradient as the previous readout gradient is still active, embodiments automatically obtain a pre-winder gradient to start data collection on an opposite side of k-space center from the side for which the following readout obtains data. This enables embodiments to collect more data points in each TR, e.g., more than the 50% of points acquired with a prior half-echo acquisition approach that required two TR intervals to collect both positive and negative sides from zero of a spoke line trajectory in a radial pattern, Indeed, some embodiments, by appropriately shifting some data collection to a point earlier than TE, can acquire up to 100% of needed sampling points for each radial line through k-space center.

The ability to capture k-space center area and the area outside this center area in the same acquisition interval provides a capability to use full echo or partial echo techniques. The availability of k-space center sample points also provides the capability for more accurate motion correction. Although some MR image reconstruction techniques can operate with just 50% of the sample points in a radial acquisition pattern, additional sample points can be used to improve data consistency.

Because example embodiments have TR and TE that are similar to those of conventional techniques such as FFE, the images obtained from embodiments may have certain properties (e.g., visible content, contrast etc.) that are similar to what users expect from popular prior pulse sequences. For example, FFE does not show additional signals obtained from bone etc., and at least some embodiments herein similarly do not capture additional signals from bone, tendon and the like. This is due to example embodiments not acquiring UTE-like signals which provide for visibility of bone and the like. It is noted that MRI applications for bone, tendon etc. that require UTE-like signals have limited clinical impact.

Embodiments herein, when compared to many conventional techniques, while substantially reducing acoustic noise also maintain a substantially consistent noise pattern (perhaps with slight pitch changes due to physical differences among gradient coils) in whatever amount of noise that is not eliminated. This is achieved by using substantially the same level of gradient amplitudes from one transition to the next throughout the entire scan.

Some embodiments may be subject to more de-phasing and sensitivity to gradient imperfections than some conventional techniques. For example, whereas longer TE allows de-phasing due, for example, to signal voids caused by turbulent flows etc., field echo-based pulse sequences may have less de-phasing loss due to UTE. However, such de-phasing is a common occurrence in sequences such as FFE. The sensitivity to gradient imperfections, due at least in part to gradient transitions occurring after excitation and before data collection, may be addressed by characterizing any such gradient delays and non-uniformities. Gradient delays and non-uniformities can be corrected as part of reconstruction by adjusting k-space data using an analytical model or numerical iterative solution.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) apparatus comprising:
   static and gradient magnetic field generators and at least one radio frequency (RF) coil disposed within said static and gradient magnetic field generators;
   RF transmitter and RF receiver circuits coupled to said at least one RF coil; and
   at least one MRI sequence control circuit including a k-space memory and at least one processor configured to control said static and gradient magnetic field generators and said RF transmitter and receiver circuits during execution of an MRI data acquisition sequence including plural successive TR (repetition time) intervals wherein:

a readout gradient, having a first polarity used to acquire and store MRI data in said k-space memory during analog-to-digital conversion (ADC) of MR RF signals during one TR interval, is continued at substantially a same amplitude and vector direction and used as an image volume selection gradient during a transmitted RF excitation pulse that begins a next TR interval before the readout gradient transitions to an opposite polarity from the first polarity.

2. The MRI apparatus as in claim 1 wherein the amplitude of said readout gradient is incrementally adjusted by less than 5% between ADC portions of TR intervals to acquire MRI data along different radially directed trajectories in k-space during successive TR intervals.

3. The MRI apparatus as in claim 1 wherein ADC acquisition of MRI data within said next TR interval begins before echo time (TE) within said next TR interval.

4. The MRI apparatus as in claim 3 wherein k-space MRI data is acquired along radially directed trajectories in k-space and said readout gradient in the next TR interval is continued after occurrence of said transmitted RF excitation pulse as a pre-winder gradient sufficient to insure an acquired MRI data trajectory in k-space during said next TR interval starts on one side of zero and continues onward, through zero, and beyond to the other side of zero in k-space.

5. The MRI apparatus as in claim 4 wherein said acquired radially directed lines of k-space data are distributed over a three-dimensional volume in k-space.

6. The MRI apparatus as in claim 1 wherein alternating gradient polarity transitions are limited to be less than 10 mT/m/ms.

7. The MRI apparatus as in claim 1 wherein a frequency response of readout gradient amplitude transitions is dimensioned, within the acquisition sequence, to approximate an acoustic frequency null point in a frequency response of the MRI apparatus.

8. The MRI apparatus as in claim 1 wherein ADC acquisition of MRI data within said next TR interval (a) begins during MR signal occurring after the transmitted RF excitation pulse but before any gradient echoes of said MR signal occur and (b) continues during subsequent occurrence of gradient echoes of said MR signal.

9. The MRI apparatus as in claim 1 wherein magnetic gradient, RF transmit and RF receive events are coordinated to acquire a substantially balanced steady-state free precession (SSFP) MRI signal.

10. A method for magnetic resonance imaging (MRI), said method comprising:

controlling MRI gradient magnetic field generators in conjunction with MRI radio frequency (RF) transmitter and receiver circuits during execution of an MRI data acquisition sequence including plural successive TR (repetition time) intervals to execute an MRI data acquisition sequence wherein:

(a) a readout gradient, having a first polarity, is used to acquire and store MRI data in k-space memory during analog-to-digital conversion (ADC) of MRI RF signals during one TR interval, and (b) said readout gradient is thereafter continued, at substantially a same amplitude and vector direction, and used as an image volume selection gradient during a transmitted RF excitation pulse that begins a next TR interval before the readout gradient transitions to an opposite polarity from the first polarity.

11. The MRI method as in claim 10 wherein the amplitude of said readout gradient is incrementally adjusted by less than 5% between ADC portions of TR intervals to acquire MRI data along different radially directed trajectories in k-space during successive TR intervals.

12. The MRI method as in claim 10 wherein ADC acquisition of MRI data within said next TR interval begins before echo time (TE) within said next TR interval.

13. The MRI method as in claim 12 wherein k-space MRI data is acquired along radially directed trajectories in k-space and said readout gradient in the next TR interval is continued after occurrence of said transmitted RF excitation pulse as a pre-winder gradient sufficient to insure an acquired MRI data trajectory in k-space during said next TR interval starts on one side of zero and continues onward, through zero, and beyond to the other side of zero in k-space.

14. The MRI method as in claim 13 wherein said acquired radially directed lines of k-space data are distributed over a three-dimensional volume in k-space.

15. The MRI method as in claim 10 wherein alternating gradient polarity transitions are limited to be less than 10 mT/m/ms.

16. The MRI method as in claim 10 wherein a frequency response of readout gradient amplitude transitions is dimensioned, within the acquisition sequence, to approximate an acoustic frequency null point in a frequency response of the MRI apparatus.

17. The MRI method as in claim 10 wherein ADC acquisition of MRI data within said next TR interval (a) begins during MR signal occurring after the transmitted RF excitation pulse but before any gradient echoes of said MR signal occur and (b) continues during subsequent occurrence of gradient echoes of said MR signal.

18. The MRI method as in claim 10 wherein magnetic gradient, RF transmit and RF receive events are coordinated to acquire a substantially balanced steady-state free precession (SSFP) MRI signal.

* * * * *